(12) United States Patent
Aligave et al.

(10) Patent No.: US 8,745,465 B1
(45) Date of Patent: Jun. 3, 2014

(54) DETECTING A BURST ERROR IN THE FRAMES OF A BLOCK OF DATA BITS

(75) Inventors: Heramba Aligave, Hyderabad (IN); Douglas M. Grant, Gorebridge (GB); Sarvendra Govindammagari, Hyderabad (IN)

(73) Assignee: Xilinx, Inc., San Jose, CA (US)

( * ) Notice: Subject to any disclaimer, the term of this patent is extended or adjusted under 35 U.S.C. 154(b) by 365 days.

(21) Appl. No.: 13/191,980

(22) Filed: Jul. 27, 2011

(51) Int. Cl.
*G11C 29/00* (2006.01)

(52) U.S. Cl.
USPC ........................................................ 714/762

(58) Field of Classification Search
USPC ................................. 714/762, 785, 788, 746
See application file for complete search history.

(56) References Cited

U.S. PATENT DOCUMENTS

| | | | |
|---|---|---|---|
| 6,381,713 B1 * | 4/2002 | Irvin et al. | 714/701 |
| 8,151,165 B2 * | 4/2012 | Belogolovy et al. | 714/762 |

OTHER PUBLICATIONS

Fujiwara, Eiji et al., "Parallel Decoding for Burst Error Control Codes" *Electronics and Communications in Japan*, translated Nov. 2002, first published online Sep. 11, 2003, printed Jan. 2004, pp. 38-48, Part 3, vol. 87, No. 1, Wiley Periodicals, Inc., Hoboken, New Jersey, USA.
IEEE, *IEEE Standard for Information Technology—Telecommunications and information exchange between systems—Local and Metropolitan Area Networks—Specific Requirements* (Part 3: Carrier Sense Multiple Access with Collision Detection (CSMA/CD) Access Method and Physical Layer Specifications, Amendment 4: Ethernet Operation over Electrical Backplanes), IEEE Std 802.3ap-2007, May 22, 2007, pp. 1-203, IEEE, New York, New York, USA.
Lin, Shu et al., *Error Control Coding: Fundamentals and Applications*, 1983, Chapter 4, pp. 85-124, Prentice Hall, Upper Saddle River, New Jersey, USA.
Lin, Shu et al., *Error Control Coding: Fundamentals and Applications*, $2^{nd}$ Ed., Jun. 7, 2004, Chapter 3, pp. 66-98, Prentice Hall, Upper Saddle River, New Jersey, USA.
Lin, Shu et al., *Error Control Coding: Fundamentals and Applications*, $2^{nd}$ Ed., Jun. 7, 2004, Chapter 5, pp. 136-193, Prentice Hall, Upper Saddle River, New Jersey, USA.
Szczepanek, Andre et al., *10GBASE-KR FEC Tutorial*, IEEE 802 plenary meeting tutorial, Jul. 17, 2006, pp. 1-87, available from the IEEE 802 LAN/MAN Standards Committee at www.ieee802.org.

* cited by examiner

*Primary Examiner* — Shelly A Chase
(74) *Attorney, Agent, or Firm* — LeRoy D. Maunu

(57) ABSTRACT

Methods and circuits detect a burst error in a block of data bits. Coset calculator circuits calculate coset leaders from a syndrome generated from the data bits of the block. The coset calculator circuits calculate the coset leaders for each frame of the data bits. For each frame, comparator circuits input a corresponding coset leader of the coset leaders. Each comparator circuit determines, for each burst-length portion of one or more burst-length portions within the corresponding coset leader, whether the coset bits of the corresponding coset leader are zero except for the coset bits within the burst-length portion. An error-locator circuit outputs an error vector describing the burst error in the block in response to one of the comparator circuits determining that the coset bits of the corresponding coset leader are zero except for the coset bits within one of the burst-length portions within the corresponding coset leader.

20 Claims, 4 Drawing Sheets

DETECTING A BURST ERROR IN THE FRAMES OF A BLOCK OF DATA BITS

FIELD OF THE INVENTION

One or more embodiments generally relate to error correction, and more particularly to forward error correction of burst errors using a cyclic block code.

BACKGROUND

To achieve high data rates through lossy channels, a receiver includes a decision feedback equalizer to compensate for inter-symbol interference and attenuation in the lossy channel. For proper compensation, the decision feedback equalizer must correctly sample the symbols transmitted through the channel. Each time the decision feedback equalizer incorrectly samples a symbol, the resulting invalid compensation frequently leads to the incorrect sampling of additional symbols. Thus, when the decision feedback equalizer incorrectly samples a symbol, the resulting error often expands to a burst error covering several symbols.

Forward error correction (FEC) augments data messages with redundant information, such as parity check bits. Certain types of forward error correction can correct isolated burst errors. There is a general need to correct burst errors using FEC circuits that have high throughput and low latency, and require low circuit area and low power.

SUMMARY

In one embodiment, a method detects a burst error in a block of data bits. A syndrome is input that is generated from the data bits of the block. A subset of the coset leaders is calculated from the syndrome for each frame of the data bits. For each burst-length portion of one or more burst-length portions within each coset leader in the subset, it is determined whether the coset bits of the coset leader are zero excepting the coset bits within the burst-length portion of the coset leader. Upon determining, for a coset leader in the subset, that the coset bits of the coset leader are zero excepting the coset bits within a burst-length portion of the coset leader, an error vector is output describing the burst error in the data bits within the frame of the block.

In another embodiment, a circuit detects a burst error in a block of data bits. Coset calculator circuits calculate coset leaders from a syndrome generated from the data bits of the block. The coset calculator circuits calculate the coset leaders for each frame of the data bits of the block. Comparator circuits are coupled to the coset calculator circuits. Each comparator circuit inputs a corresponding coset leader of the coset leaders for each frame. Each comparator circuit determines, for each burst-length portion of multiple burst-length portions within the corresponding coset leader, whether the coset bits of the corresponding coset leader are zero except for the coset bits within the burst-length portion. An error-locator circuit is coupled and responsive to the comparator circuits. The error-locator circuit outputs an error vector describing the burst error in the block in response to one of the comparator circuits determining that the coset bits of the corresponding coset leader are zero except for the coset bits within one of the burst-length portions within the corresponding coset leader.

A circuit detects a burst error in a block of data bits in another embodiment. The circuit includes multiple coset calculator circuits, multiple comparator circuits, and an error-locator circuit. Each coset calculator circuit calculates a respective coset leader from a syndrome generated from the data bits of the block. Each coset calculator circuit calculates the respective coset leader for each frame of the data bits of the block. Each comparator circuit is coupled to input the respective coset leader from one or more of the coset calculator circuits. Each comparator circuit determines, for a burst-length portion within the respective coset leader, whether the coset bits of the respective coset leader are zero except for the coset bits within the burst-length portion. The error-locator circuit is coupled and responsive to the comparator circuits. The error-locator circuit outputs an error vector describing the burst error in the block in response to one of the comparator circuits determining that the coset bits of the respective coset leader are zero except for the coset bits within the burst-length portion within the respective coset leader.

It will be appreciated that various other embodiments are set forth in the Detailed Description and Claims which follow.

BRIEF DESCRIPTION OF THE DRAWINGS

Various aspects and advantages of the disclosed embodiments will become apparent upon review of the following detailed description and upon reference to the drawings, in which.

DETAILED DESCRIPTION

Figure 1:
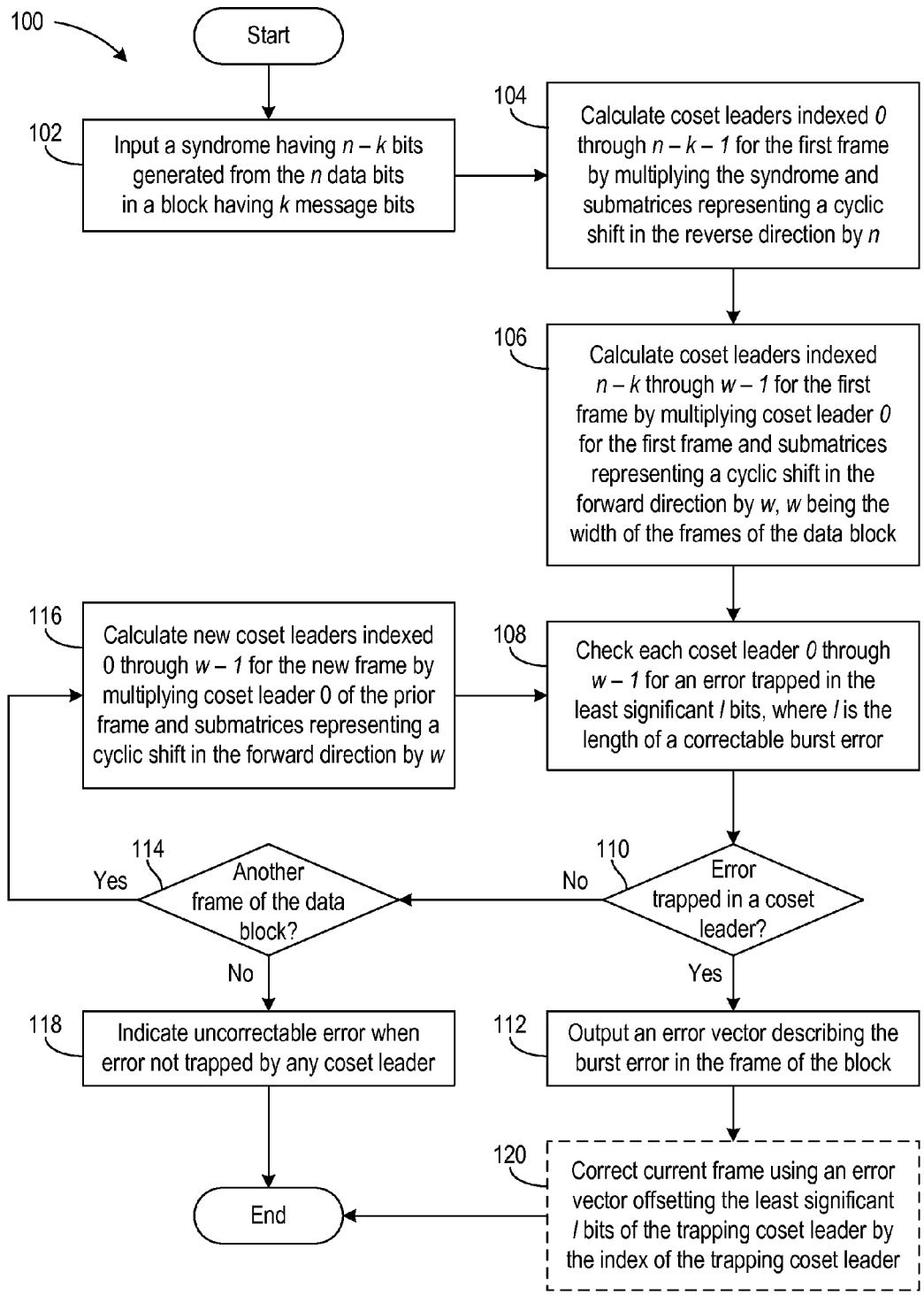
FIG. 1 is a flow diagram of a process for detecting and correcting a burst error in a data block.

Embodiments of the invention determine whether forward error correction can correct a burst error in received data blocks. The burst error may result from various sources, such as a decision feedback equalizer extending the corruption of a single incorrectly sampled bit into a burst of corrupted data bits. To achieve high throughput with low latency, a parallel architecture detects the burst errors.

In one embodiment for 10 Gigabit BackPlane Ethernet of the 10G-BASE KR 802.3ap 2007 IEEE standard, each data block of N bits includes K message bits and N−K parity check bits. A shortened block cyclic code generates the N−K parity check bits from the K message bits. The shortened cyclic code is obtained from an original block cyclic code having K=42955 message bits in each block of N=42987 bits, but this block cyclic code is shortened by setting the leading 40875 message bits of each block to zero. This results in the shortened block cyclic code with each data block of N=2112 bits including K=2080 message bits and N−K=32 parity check bits. This shortened block cyclic code has the capability of detecting and correcting a burst error of up to L=11 corrupted bits in each data block.

The generator polynomial for the original and shortened block cyclic codes is:

$$g(x)=x^{32}+x^{23}+x^{21}+x^{11}+x^2+1.$$

A linear feedback shift register (LFSR) with feedback taps in correspondence with the generator polynomial could generate the parity check bits for each block from the message bits of the block. A similar LFSR could detect and help correct burst errors in the received version of the data block. However, these LFSR circuits shift at a rate matching the communication data rate, and this shift rate exceeds the capabilities of certain circuit technologies.

Alternatively, the generator polynomial helps generate a generator matrix, and a row vector of the N data bits of each data block results from multiplying a row vector of the K message bits of the data block by the generator matrix G having K rows by N columns. Because the shortened block cyclic code is systematic with the K message bits appearing unmodified as the first K data bits of each block of N data bits, the generator matrix, $G[K \times N]=I[K \times K]|P^T[K \times N-K]$. Thus, the generator matrix concatenates $I[K \times K]$, which is a K-bit by K-bit identity matrix, and $P^T[K \times N-K]$, which is the party matrix having K rows and N-K columns. The parity check matrix to detect and correct the burst errors is $H[N-K \times N]=P[N-K \times K]|I[N-K \times N-K]$, and the N-K bits of the syndrome result from multiplying the received data block times the parity check matrix. A corresponding parallel implementation could have an encoder with a respective exclusive-or tree for generating each of the N-K parity check bits, and a checker with a respective exclusive-or tree for generating each of the N-K syndrome bits; however, these large exclusive-or trees require extensive circuit area and have high power consumption.

In one embodiment, a communication channel transfers each data block of N data bits in a sequence of Q frames each having W data bits. In one example, the N=2112 bits of each data block are divided into Q=32 frames, and in each clock cycle a data bus transfers the W=66 bits of each frame in parallel. Instead of processing the data bits one at a time with an LFSR, or processing the entire block N data bits in parallel, the data bits and the syndrome are processed in parallel over each frame of W data bits. This parallel processing per frame reduces the operating frequency to accommodate additional circuit technologies, and has small exclusive-or trees to reduce circuit area and provide low power consumption. The generator submatrix for each frame is:

$G=I[W \times W]|0[W \times N-K]$ modulo $g(x)$ on each row=0
$[W \times W]|P^T[W \times N-K]$.

The module division by the generator polynomial $g(x)$ makes the encoding systematic via a successive Euclidean division that produces the parity submatrix $P^T[W \times N-K]$. The transposed form of this parity submatrix is denoted the parity encoding submatrix $P^T[W \times N-K]$ when used to generate the parity check bits during encoding, and the non-transposed form of this parity submatrix is denoted the parity check submatrix $P[N-K \times W]$ when used to generate and process the syndrome during decoding.

The syndrome indicates an error in its data block when the syndrome is non-zero. If the error is a single burst error with the corrupted bits confined within up to L contiguous data bits of the data block, the syndrome provides an encoded specification of the burst error. To decode the location and value of the burst error from the syndrome, coset leaders are calculated from the syndrome. The coset leader with index M in each frame effectively shifts the syndrome through the LFSR for the generator polynomial by a corresponding number of steps. In one embodiment, the coset leader with index 0 in the first frame effectively shifts the syndrome through the LFSR by a number of steps equaling the 40875 leading zeroes inserted into the message bits of the original block cyclic code. In general for this embodiment, the coset leader with index M in the first frame requires a cyclic shift of 40875+M steps, and the coset leader with index M in a subsequent frame with index Q requires a cyclic shift of 40875+QW+M steps.

An equivalent formulation performs an associated cyclic shift in the reverse direction that effectively cancels a cyclic shift in the forward direction by the same number of steps. In one embodiment, this reverse cyclic shift reduces the needed number of shift steps to N=2112 steps for calculating the coset leader with index 0 in the first frame. A corresponding parity check submatrix for this cyclic shift in the reverse direction by N steps is the submatrix $P^{-N}[N-K \times 2(N-K)]$ selected to have 2(N-K) columns. It will be appreciated that the submatrix $P^{-N}[N-K \times 2(N-K)]$ equals a corresponding submatrix representing a cyclic shift in the forward direction by the number of leading zeros used to shorten the original block cyclic code.

To decode the location and value of the burst error from the syndrome, coset leaders are calculated from the syndrome. The coset leader $E^M$ with index M within the first frame for certain M from 0 to N-K-1 is:

$E^M[1 \times N-K]=S[1 \times N-K]P^{-N}[N-K \times M:M+(N-K-1)]$ where $S[1 \times N-K]$ is the syndrome and $P^{-N}[N-K \times M:M+(N-K-1)]$ is a square submatrix having its first through last columns as columns M through M+(N-K-1) of the submatrix $P^{-N}[N-K \times 2(N-K)]$. However, if index M is greater than N-K-1, the submatrix $P^{-N}[N-K \times 2(N-K)]$ does not have enough columns to fill out the square submatrix $P^{-N}[N-K \times M:M+(N-K-1)]$. While a submatrix of $P^{-N}$ with more columns could be used to calculate the remaining coset leaders for the first frame, one embodiment instead uses the coset leader $E^0$ calculated from the preceding equation, and this coset leader $E^0$ is a reverse cyclic shift of the syndrome by N steps. The coset leader $E^M$ with index M from N-K to W-1 in the first frame is:

$E^M[1 \times N-K]=E^0[1 \times N-K]P[N-K \times M-(N-K-1):M]$ where $P[N-K \times M-(N-K-1):M]$ is the square submatrix having its first through last columns as columns M-(N-K-1) through M of the parity check submatrix $P[N-K \times W]$. Similarly, the coset leader $E^M$ with index M from 1 to W-1 in each successive frame after the first frame is:

$E^M[1 \times N-K]=E^0[1 \times N-K]X[N-K \times M:M+(N-K-1)]$ where coset leader $E^0$ is the coset leader $E^W$ for the preceding frame, and $X[N-K \times M:M+(N-K-1)]$ is the square submatrix having its first through last columns as columns M through M+(N-K-1) of the extended parity check submatrix $X[N-K \times W+(N-K-1)]$ that concatenates columns for successively increasing negative shifts onto the parity check submatrix $P[N-K \times W]$. Coset leader $E^W$ for the preceding frame is:

$E^W[1 \times N-K]=E^0[1 \times N-K]P[N-K \times W-(N-K-1):W]$.

For each frame, the W coset leaders calculated for the frame specify the location and value of any burst error confined within up to L contiguous data bits of the frame with potential overlap to any following frame. A coset leader $E^M$ for a frame traps the burst error provided the coset leader satisfies:

$E^M[1 \times N-K]=0[1 \times N-K-L]|B[1 \times L]$ where $0[1 \times N-K-L]$ is a row vector of N-K-L zeroes and $B[1 \times L]$ is an L-bit error vector having a value of one for each corrupted bit of the burst error, and the position of the corrupted bits specified by burst error vector $B[1 \times L]$ begins at bit M within the frame. In one embodiment with N-K=32 and L=11, the least significant 11 bits of coset leader $E^M$ for a frame specify a burst error beginning at bit M in the frame if the remaining most significant 21 bits of the coset leader $E^M$ are zero. When a burst error is confined within less than L bits, multiple coset leaders trap the burst error; for example, when a data block has only one corrupted bit, L coset leaders trap the single bit error.

FIG. 1 is a flow diagram of a process 100 for detecting and correcting a burst error in a data block. Process 100 generates an error vector describing the burst error from the syndrome for the data block.

At block 102, a syndrome is input that is generated from the N data bits of a data block having K message bits. The syndrome indicates an error in the data block when the syndrome has a non-zero value. Process 100 processes the syndrome by frames to determine whether the error is a correctable burst error or an error that is uncorrectable.

At block 104, coset leaders $E^M$ with index M from 0 through N−K−1 are calculated for the first frame by multiplying the syndrome and each of submatrices $P^{−N}[N−K\times M:M+(N−K−1)]$ representing a cyclic shift in the reverse direction by N. At block 106, coset leaders $E^M$ with index M from N−K to W−1 are calculated for the first frame by multiplying the coset leader $E^0$ calculated at block 104 and each of submatrices $P[N−K\times M−(N−K−1):M]$ representing a cyclic shift in the forward direction by the W bits in each frame.

At block 108, all of the possible coset leaders of the current frame are checked to determine whether the coset bits of each coset leader are zero excepting the single burst-length portion in the L least significant coset bits. If the N−K−L most significant bits of a coset leader $E^M$ are zero, then the coset leader $E^M$ traps the burst error, and the L least significant bits of the coset leader $E^M$ specify the burst error beginning at bit M in the current frame.

Decision block 110 checks whether the burst error is trapped in any of the coset leaders $E^M$ for the current frame. If a burst error is trapped, process 100 proceeds to block 112; otherwise, process 100 proceeds to decision block 114.

Decision block 114 checks whether the data block has another frame. If the data block has another frame, process 100 proceeds to block 116; otherwise, process 100 proceeds to block 118.

At block 116, a new coset leader $E^0$ of the current frame is calculated by multiplying coset leader $E^0$ of the prior frame and the parity check submatrix $P[N−K\times W−(N−K−1):W]$ representing a cyclic shift in the forward direction by W. Coset leaders $E^M$ with index M from 1 to W−1 are calculated for the current frame by multiplying the coset leader $E^0$ of the current frame and each of the submatrices $X[N−K\times M:M+(N−K−1)]$ representing a cyclic shift in the forward direction by W. Process 100 then proceeds to block 108 to check whether the new coset leaders trap a burst error.

If an error is trapped in a coset leader $E^M$ of one of the frames, an error vector describing the burst error in the frame is output at block 112. The error vector is the least significant L bits of the trapping coset leader $E^M$, with L being the burst-length error correction capability of the forward error correction code.

At optional block 120, the burst error in the frame is corrected by a bit-wise exclusive-or between the frame and an offsetting of the error vector by the index M of the trapping coset leader $E^M$ of the frame.

If an error is not trapped in any coset leader of any of the frames, an uncorrectable error is indicated at block 118. The error might be uncorrectable because the error is a burst error with a length exceeding L bits.

It will be appreciated that certain corruption of a data block might cause false trapping of a burst error when the number of corrupted data bits approaches or exceeds the hamming distance of the forward error correction code. When false trapping occurs, the attempted correction of the error generally extends the corruption. However, the data block might encode a higher-level protocol that includes, for example, a cyclic redundancy check over a portion of the data block. Thus, the attempted correction of the falsely trapped error might extend the corruption and enable detection of the corruption by a higher-level protocol.

Figure 2:
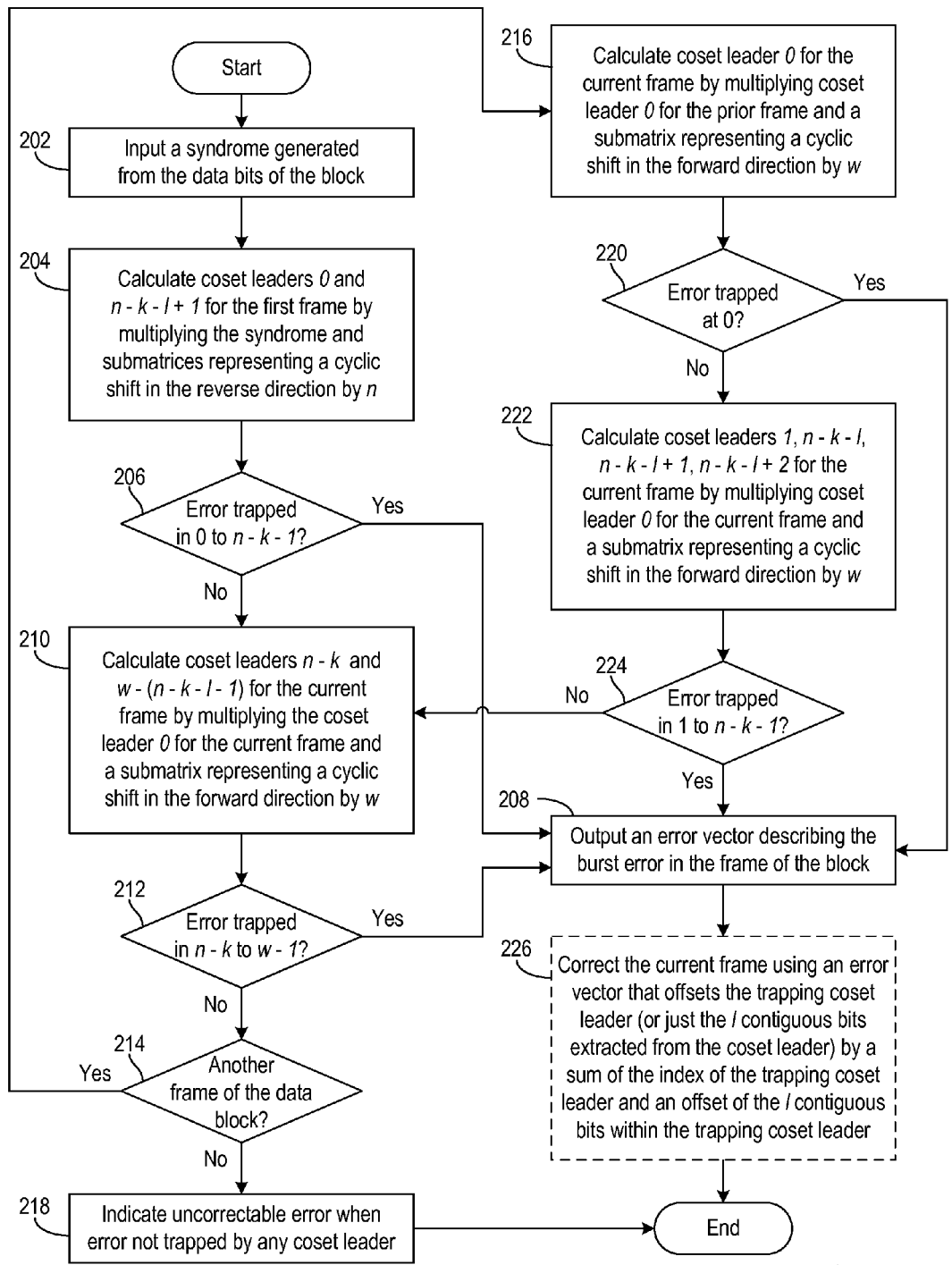
FIG. 2 is a flow diagram of a process for pre-emptive trapping of a burst error in a data block.

FIG. 2 is a flow diagram of a process 200 for pre-emptive trapping of a burst error in a data block. A difference between process 200 of FIG. 2 and process 100 of FIG. 1 is that process 200 calculates a proper subset of the coset leaders for each frame instead of calculating all of the coset leaders for each frame. Process 200 begins by inputting a non-zero syndrome at block 202.

It was discovered that the coset leaders satisfy the property:

$$E^{M-1}[1\times L−1:0]=E^M[1\times L:1]$$

when coset leader $E^{M-1}$ traps a burst error for a particular frame. In addition, when coset leader $E^{M-1}$ traps a burst error because the N−K−L most significant bits of coset leader $E^{M-1}$ are zero, coset leader $E^M$ indicates this trapping because the N−K−L−1 most significant bits and the least significant bit of coset leader $E^M$ are zero. This property can be extended within certain empirically determined limits, such that coset leader $E^M$ can trap burst errors for coset leaders $E^{M-1}$ and $E^{M-2}$ et cetera. Thus, the calculation of coset leaders $E^{M-1}$ and $E^{M-2}$ et cetera is omitted in one embodiment, and a proper subset of the possible coset leaders are calculated for each frame. Because fewer coset leaders are calculated for each frame, fewer exclusive-or trees are needed to calculate these coset leaders, and this reduces circuit area and power consumption. For some or all of the coset leaders in the proper subset, multiple burst-length portions, such as $E^M[1\times L−1:0]$, $E^M[1\times L:1]$, and $E^M[1\times L+1:2]$ et cetera, are checked for trapping a burst error when all of the other coset bits are zero.

At block 204, coset leaders $E^M$ for indices M equal to 0 and N−K−L+1 are calculated for the first frame by multiplying the syndrome with a respective submatrix $P^{−N}[N−K\times M:M+(N−K−1)]$ representing a cyclic shift in the reverse direction by N. Decision block 206 checks whether a burst error is trapped in multiple burst-length portions within either of these two coset leaders. The two coset leaders collectively cover burst-length portions at offsets 0 to N−K−1 in the first frame. If a burst error is trapped, process 200 proceeds to block 208; otherwise, process 200 proceeds to block 210.

At block 210, coset leaders $E^M$ for indices M of N−K and W−(N−K−L−1) are calculated for the current frame by multiplying the coset leader $E^0$ for the current frame with a respective submatrix $P[N−K\times M−(N−K−1):M]$ representing a cyclic shift in the forward direction by W. Decision block 212 checks whether a burst error is trapped in multiple burst-length portions within either of these two coset leaders. The two coset leaders collectively cover burst-length portions at offsets N−K to W−1 in the current frame. If a burst error is trapped, process 200 proceeds to block 208; otherwise, process 200 proceeds to decision block 214.

Decision block 214 checks whether the data block has another frame. If the data block has another frame, process 200 proceeds to block 216; otherwise, process 200 proceeds to block 218.

At block 216, a new coset leader $E^0$ of the current frame is calculated by multiplying coset leader $E^0$ of the prior frame and the parity check submatrix $P[N−K\times W−(N−K−1):W]$ representing a cyclic shift in the forward direction by W. Decision block 220 checks whether a burst error is trapped within the burst-length portion in the least significant L bits of the new coset leader $E^0$. If a burst error is trapped, process 200 proceeds to block 208; otherwise, process 200 proceeds to block 222.

At block 222, coset leaders $E^M$ for indices M of 1, N−K−L, N−K−L+1, and N−K−L+2 are calculated for the current frame by multiplying the coset leader $E^0$ of the current frame with a respective submatrix $X[N-K\times M:M+(N-K-1)]$ representing a cyclic shift in the forward direction by W. Decision block 224 checks whether a burst error is trapped within multiple burst-length portions of these four coset leaders. These four coset leaders collectively cover burst-length portions at offsets 1 to $N-K-1$ in the current frame. If a burst error is trapped, process 200 proceeds to block 208; otherwise, process 200 returns to block 210 to calculate and check the remaining two coset leaders for the current frame.

If an error is trapped in a coset leader $E^M$ of one of the frames, an error vector describing the burst error in the frame is output at block 208. The error vector is the associated burst-length portion of L contiguous bits of the trapping coset leader $E^M$.

At optional block 226, the burst error in the frame is corrected by a bit-wise exclusive-or between the frame and an offsetting of the error vector by a sum of the index M of the trapping coset leader $E^M$ and an offset of the trapping burst-length portion.

If an error is not trapped in any coset leader of any of the frames, an uncorrectable error is indicated at block 218.

Figure 3:
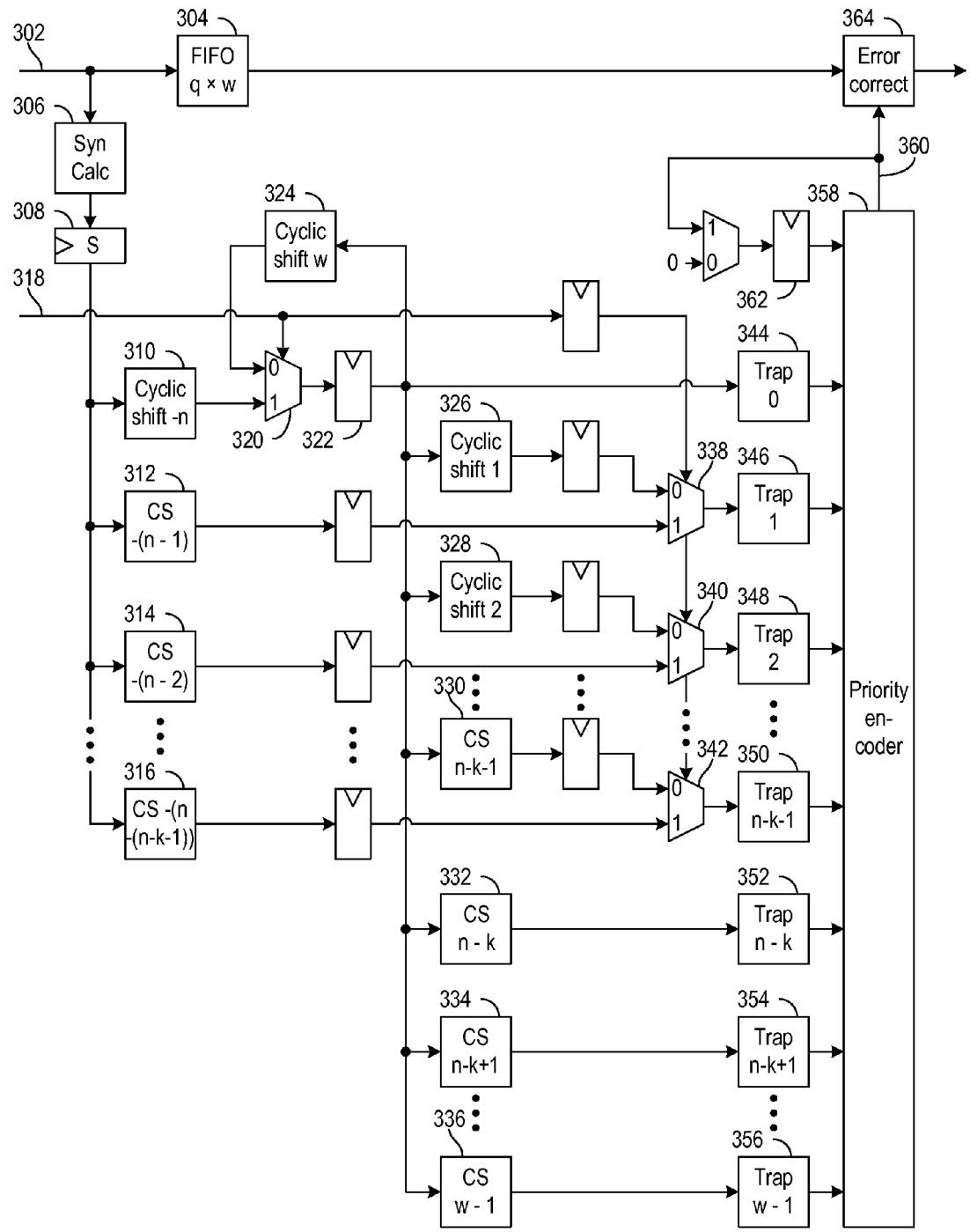
FIG. 3 is a block diagram of a circuit for detecting and correcting a burst error in a data block.

FIG. 3 is a block diagram of a circuit for detecting and correcting a burst error in a data block. The data block is input as W-bit frames on line 302 and stored in queue 304 while syndrome calculator 306 calculates the syndrome and the circuit processes the syndrome to isolate any burst error.

In one embodiment, the coset calculator circuits 310, 312, 314, through 316 are exclusive-or networks calculating coset leaders $E^M$ for the respective indices M of 0, 1, 2, through $N-K-1$ in parallel for the first frame. The exclusive-or networks of circuits 310, 312, 314, through 316 effectively multiply the syndrome from register 308 with submatrices representing a cyclic shift in the reverse direction by N.

Upon the syndrome for each data block becoming available in register 308, the control signal on line 318 asserts to indicate the first frame of the Q frames in the data block. Assertion of the control signal on line 318 causes multiplexer 320 to load into register 322 the coset leader $E^0$ for the first frame from coset calculator circuit 310. Deassertion of the control signal on line 318 for subsequent frames causes multiplexer 320 to load the coset leader $E^0$ from coset calculator circuit 324 into register 322. Coset calculator circuit 324 calculates a new coset leader $E^0$ by effectively multiplying the prior coset leader $E^0$ from register 322 and a parity check submatrix representing a cyclic shift in the forward direction by W.

In one embodiment, the coset calculator circuits 326, 328, through 330, and 332, 334, through 336 are exclusive-or networks calculating coset leaders $E^M$ for the respective indices M of 1, 2, through $N-K-1$, and $N-K, N-K+1$, through $W-1$ in parallel for each frame. However, multiplexers 338, 340, through 342 discard the outputs of coset calculator circuits 326, 328, through 330 for the first frame, and instead substitute corresponding coset leaders from coset calculator circuits 312, 314, through 316. The exclusive-or networks of circuits 326, 328, through 330, and 332, 334, through 336 effectively multiply the coset leader $E^0$ for a frame from register 322 with submatrices representing a cyclic shift in the forward direction by W.

Comparator circuits 344, 346, 348, through 350, 352, 354, through 356 check all of the coset leaders $E^M$ with the respective indices M of 0, 1, 2, through $N-K-1$, and $N-K, N-K+1$, through $W-1$ in parallel for each frame. These comparator circuits check whether each coset leader is zero excepting the single burst-length portion in the L least significant bits of the coset leader. If the $N-K-L$ most significant bits of a coset leader $E^M$ are zero, then the coset leader $E^M$ traps the burst error, and the L least significant bits of the coset leader $E^M$ specify the burst error beginning at bit M in the current frame.

Priority encoder 358 is an error-locator circuit that checks whether any of the comparator circuits 344, 346, 348, through 350, 352, 354, through 356 trap a burst error for the current frame. If an error is trapped in a coset leader $E^M$ of a frame, priority encoder 358 outputs an error vector on line 360 describing the burst error in the frame. The error vector on line 360 is the least significant L bits of the trapping coset leader $E^M$. Certain burst errors can span between the end of one frame and the beginning of the next frame, and register 362 stores the portion of the error vector for the beginning of the next frame for such burst errors. In one embodiment, the priority encoder 358 selects the error vector on line 360 from the trapping coset leader $E^M$ having the smallest index M, but giving priority to a wrap-around error stored in register 362.

Error-corrector circuit 364 successively inputs each frame from queue 304. After priority encoder 358 outputs an error vector on line 360 describing a burst error in a frame, error-corrector circuit 364 outputs a correction of the frame. This correction is a bit-wise exclusive-or between the data bits in the frame and the error vector on line 360. The error-corrector circuit 364 outputs the frame when none of the comparator circuits 344, 346, 348, through 350, 352, 354, through 356 trap a burst error.

Figure 4:
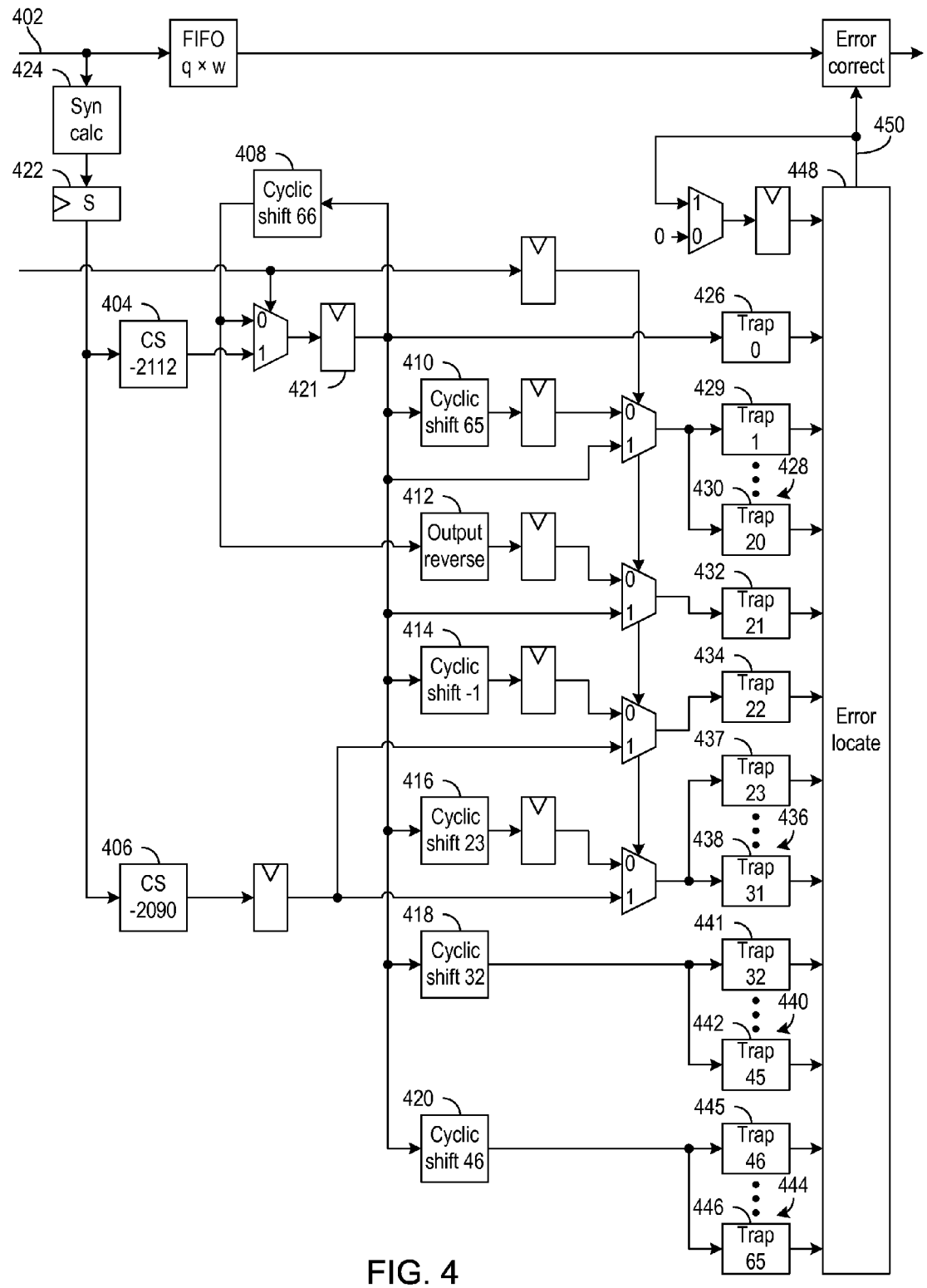
FIG. 4 is a block diagram of an example circuit for pre-emptive trapping of a burst error in a data block.

FIG. 4 is a block diagram of an example circuit for pre-emptive trapping of a burst error in a data block. In this example, the N=2112 bits of each data block are divided into Q=32 frames, and in each clock cycle the data bus on line 402 transfers W=66 bits of a frame. The circuit calculates the proper subset of the sixty-six possible coset leaders for each frame to isolate burst errors corrupting up to L=11 contiguous data bits.

The eight coset calculator circuits 404, 406, 408, 410, 414, 416, 418, and 420 are configured to calculate respective coset leaders $E^M$ with respective indices M of 0, $N-K-L+1=22, W=66$ or index 0 of the next successive frame, 1, $N-K-L+1=22, N-K-L+2=23, N-K=32$, and $W-(N-K-L-1)=46$. The output reversal of block 412 enables coset calculator circuit 408 to also calculate the coset leader $E^M$ with index M of $N-K-L=21$. The eight coset calculator circuits 404, 406, 408, 410, 414, 416, 418, and 420 are configured to calculate, in parallel, the respective coset leaders that equal, respectively, a reverse cyclic shift by N of the syndrome, a reverse cyclic shift by $K+L-1$ of the syndrome, a cyclic shift by W of the coset leader with index 0 for the preceding frame from register 421, a cyclic shift by $W-1$ of the coset leader from register 421, a reverse cyclic shift by 1 of the coset leader from register 421, a cyclic shift by $N-K-L+2$ of the coset leader from register 421, a cyclic shift by $N-K$ of the coset leader from register 421, and a cyclic shift by $W-N+K+L+1$ of the coset leader from register 421.

The coset calculator circuits 404 and 406 include an exclusive-or network configured to calculate the respective coset leaders for the initial frame from the syndrome stored in register 422, and the coset calculator circuits 408, 410, 414, 416, 418, and 420 include an exclusive-or network configured to calculate the respective coset leaders from the coset leader calculated by coset calculator circuits 404 or 408. However, the eight coset calculator circuits 404, 406, 408, 410, 414, 416, 418, and 420 ultimately calculate the respective coset leaders from the syndrome stored in register 422. The respective coset leaders calculated at the initial frame by coset calculator circuits 408, 410, 414, and 416 are ignored.

Syndrome calculator 424 calculates the syndrome having $N-K$ bits from the data bits of each data block.

A first comparator circuit 426 inputs the corresponding coset leader $E^0$ for each frame and determines whether the coset bits of coset leader $E^0$ are zero except for the coset bits within the burst-length portion of the least significant L=11 bits.

A second comparator circuit 428 includes subcircuits 429 through 430. This second comparator circuit 428 inputs the corresponding coset leader $E^0$ for the initial frame, and the corresponding coset leader $E^1$ for each frame other than the initial frame. Subcircuit 429 determines whether the corresponding coset leader is zero except for the L-bit burst-length portion beginning at index 1, and subcircuit 430 determines whether the corresponding coset leader is zero except for the L-bit burst-length portion beginning at index 20.

A third comparator circuit 432 inputs the corresponding coset leader $E^0$ for the initial frame, and the corresponding coset leader $E^{21}$ for each frame other than the initial frame. Comparator circuit 432 determines whether the corresponding coset leader is zero except for the L-bit burst-length portion beginning at index 21.

A fourth comparator circuit 434 inputs the corresponding coset leader $E^{22}$ for each frame. Comparator circuit 432 determines whether the corresponding coset leader is zero except for the L-bit burst-length portion beginning at index 22.

A fifth comparator circuit 436 includes subcircuits 437 through 438. This fifth comparator circuit 436 inputs the corresponding coset leader $E^{22}$ for the initial frame, and the corresponding coset leader $E^{23}$ for each frame other than the initial frame. Subcircuits 437 through 438 determine whether the corresponding coset leader is zero except for the L-bit burst-length portion beginning at respective indices 23 through 31.

A sixth comparator circuit 440 includes subcircuits 441 through 442. This sixth comparator circuit 440 inputs the corresponding coset leader $E^{32}$ for each frame. Subcircuits 441 through 442 determine whether the corresponding coset leader is zero except for the L-bit burst-length portion beginning at respective indices 32 through 45.

A seventh comparator circuit 444 includes subcircuits 445 through 446. This seventh comparator circuit inputs the corresponding coset leader $E^{46}$ for each frame. Subcircuits 445 through 446 determine whether the corresponding coset leader is zero except for the L-bit burst-length portion beginning at respective indices 46 through 65.

The comparator circuits 426, 428, 432, 434, 436, 440, and 444 trap burst errors in parallel.

An error-locator circuit 448 outputs an error vector on line 450 describing the burst error in the block when one of the comparator circuits 428, 436, 440, or 444 determines that the coset bits of the corresponding coset leader are zero except for the coset bits within one of multiple burst-length portions within the corresponding coset leader. The error-locator circuit 448 also outputs an error vector on line 450 describing the burst error in the block when one of the comparator circuits 426, 432, or 434 determines that the coset bits of the corresponding coset leader are zero except for the coset bits within a single burst-length portion within the corresponding coset leader.

In one embodiment, the error-locator circuit 448 includes a priority encoder configured to determine, for each frame, the comparator circuit having a highest priority within a subset of the comparator circuits for which the coset bits of the corresponding coset leader are zero, excepting those coset bits within one of the burst-length portions within the corresponding coset leader for the frame.

The eight coset calculator circuits 404, 406, 408, 410, 414, 416, 418, and 420 includes every coset calculator circuit needed to detect the burst error described by the error vector on line 450, and these eight coset calculator circuits number less than one-quarter of W=66.

One or more embodiments are thought to be applicable to a variety of systems for detecting a burst error in a block of data bits. Other aspects and embodiments will be apparent to those skilled in the art from consideration of the specification. The one or more embodiments may be implemented as one or more processors configured to execute software, as an application specific integrated circuit (ASIC), or as a circuitry in programmable logic. It is intended that the specification and illustrated embodiments be considered as examples only, with a true scope of the invention being indicated by the following claims.

What is claimed is:

1. A method of detecting a burst error in a block of a plurality of data bits, comprising:
inputting a syndrome generated from the plurality of data bits of the block; and
for each frame of a plurality of frames of the plurality of data bits of the block:
calculating in parallel, from the syndrome, a subset of a plurality of coset leaders for the frame;
determining in parallel for coset leaders in the subset, whether each coset leader in the subset traps the burst error, wherein the determining includes for each coset leader in the subset, determining for each burst-length portion of one or more burst-length portions within the coset leader whether a plurality of coset bits of the coset leader are zero excepting the plurality of coset bits within the burst-length portion of the coset leader; and
in response to determining, for a coset leader in the subset, that the plurality of coset bits of the coset leader are zero excepting the plurality of coset bits within the burst-length portion of the coset leader, outputting an error vector describing the burst error in the plurality of data bits within the frame of the block.

2. The method of claim 1, wherein:
the subset of the plurality of coset leaders for each frame is a proper subset of the plurality of coset leaders for the frame; and
the one or more burst-length portions within a coset leader in the proper subset is a plurality of burst-length portions within the coset leader.

3. The method of claim 1, wherein:
the subset of the plurality of coset leaders for each frame is all of the plurality of coset leaders for the frame; and
the one or more burst-length portions within each coset leader in the subset is a single burst-length portion within the coset leader.

4. The method of claim 1, further comprising correcting the burst error in the block using the error vector.

5. A circuit for detecting a burst error in a block of a plurality of data bits, comprising:
a plurality of coset calculator circuits configured to calculate a plurality of coset leaders in parallel from a syndrome generated from the plurality of data bits of the block;
wherein the plurality of coset calculator circuits are configured to calculate the plurality of coset leaders for each of a plurality of frames of the plurality of data bits of the block;
a plurality of comparator circuits coupled to the plurality of coset calculator circuits, each comparator circuit being configured to input a corresponding coset leader of the plurality of coset leaders for each of the plurality of frames;

wherein each comparator circuit is configured to determine in parallel with each other comparator circuit, for each burst-length portion of a plurality of burst-length portions within the corresponding coset leader, whether a plurality of coset bits of the corresponding coset leader are zero except for the plurality of coset bits within the burst-length portion; and an error-locator circuit coupled and responsive to the plurality of comparator circuits, the error-locator circuit being configured to output an error vector describing the burst error in the block in response to one of the plurality of comparator circuits determining that the plurality of coset bits of the corresponding coset leader are zero except for the plurality of coset bits within one of the plurality of burst-length portions within the corresponding coset leader.

6. The circuit of claim 5, wherein:

each of the plurality of frames includes W of the plurality of data bits of the block; and the plurality of coset calculator circuits includes every coset calculator circuit in the circuit for detecting the burst error described by the error vector, and the plurality of coset calculator circuits number less than one-quarter of W.

7. The circuit of claim 5, wherein:

each coset calculator circuit of the plurality of coset calculator circuits is configured to calculate a respective coset leader of the plurality of coset leaders; and the coset calculator circuit includes an exclusive-or network configured to calculate the respective coset leader from one of the syndrome or the respective coset leader from one or more of the plurality of coset calculator circuits.

8. The circuit of claim 5, wherein:

the plurality of coset calculator circuits are configured to calculate, in parallel for each frame of the plurality of frames, the plurality of coset leaders for the frame; and the plurality of comparator circuits are configured to determine, in parallel for each frame of the plurality of frames, whether the plurality of coset bits of the corresponding coset leader are zero except for the plurality of coset bits within each of the plurality of burst-length portions within the corresponding coset leader for the frame.

9. The circuit of claim 5, wherein, for a comparator circuit of the plurality of comparator circuits:

the comparator circuit is configured to input the corresponding coset leader that, for an initial frame of the plurality of frames, is one of the plurality of coset leaders from one of the plurality of coset calculator circuits; and the comparator circuit is configured to input the corresponding coset leader that, for each of the plurality of frames other than the initial frame, is another one of the plurality of coset leaders from another one of the plurality of coset calculator circuits.

10. The circuit of claim 5, wherein:

the one of the plurality of comparator circuits is configured to input the corresponding coset leader for each of the plurality of frames; and the error-locator circuit is configured to output the error vector that specifies the plurality of coset bits within the one of the plurality of burst-length portions within the corresponding coset leader for the frame.

11. The circuit of claim 5, wherein the error-locator circuit includes a priority encoder configured to determine, for each of the plurality of frames, the one of the plurality of comparator circuits having a highest priority within a subset of the plurality of comparator circuits for which the plurality of coset bits of the corresponding coset leader are zero except for the plurality of coset bits within one of the plurality of burst-length portions within the corresponding coset leader for the frame.

12. The circuit of claim 5, further comprising an error-corrector circuit coupled to the error-locator circuit, wherein:

the error-corrector circuit successively inputs each frame of the plurality of frames;

the error-corrector circuit outputs a correction of the frame in response to the one of the plurality of comparator circuits determining that the plurality of coset bits of the corresponding coset leader are zero except for the plurality of coset bits within the one of the plurality of burst-length portions within the corresponding coset leader for the frame, the correction being a bit-wise exclusive-or between the plurality of data bits in the frame and the plurality of coset bits within the one of the plurality of burst-length portions within the corresponding coset leader for the frame; and the error-corrector circuit outputs the frame in response to none of the plurality of comparator circuits determining that the plurality of coset bits of the corresponding coset leader are zero except for the plurality of coset bits within one of the plurality of burst-length portions within the corresponding coset leader for the frame.

13. The circuit of claim 5, wherein the plurality of coset calculator circuits includes:

a first coset calculator circuit configured to calculate the coset leader with index 0 for an initial frame of the plurality of frames in the data block;

a second coset calculator circuit configured to calculate the coset leader with index $N-K-L+1$ for the initial frame;

a third coset calculator circuit configured to calculate the coset leader with index 1 for each of the plurality of frames other than the initial frame;

a fourth coset calculator circuit configured to calculate the coset leader with index $N-K-L+2$ for each of the plurality of frames other than the initial frame;

a fifth coset calculator circuit configured to calculate the coset leader with index $N-K$ for each of the plurality of frames; and a sixth coset calculator circuit configured to calculate the coset leader with index $W-N+K+L+1$ for each of the plurality of frames.

14. The circuit of claim 13, wherein:

the block has a width N for the plurality of data bits;

each of the plurality of frames has a width W;

the syndrome has a width $N-K$; and each burst-length portion of the plurality of burst-length portions of the corresponding coset leader for each comparator circuit has a width L.

15. The circuit of claim 13, wherein the plurality of comparator circuits includes:

a first comparator circuit configured to input, from the first coset calculator circuit, the corresponding coset leader that is the coset leader with index 0 for the initial frame, and to input, from the third coset calculator circuit, the corresponding coset leader that is the coset leader with index 1 for each of the plurality of frames other than the initial frame;

a second comparator circuit configured to input, from the second coset calculator circuit, the corresponding coset leader that is the coset leader with index N−K−L+1 for the initial frame, and to input, from the fourth coset calculator circuit, the corresponding coset leader that is the coset leader with index N−K−L+2 for each of the plurality of frames other than the initial frame;

a third comparator circuit configured to input, from the fifth coset calculator circuit, the corresponding coset leader that is the coset leader with index N−K for each of the plurality of frames; and a fourth comparator circuit configured to input, from the sixth coset calculator circuit, the corresponding coset leader that is the coset leader with index W−N+K+L+1 for each of the plurality of frames.

16. The circuit of claim 5, wherein the plurality of coset calculator circuits include:

a first coset calculator circuit configured to calculate the coset leader with index 0 for an initial frame of the plurality of frames in the data block, the coset leader with index 0 for the initial frame being calculated to equal a reverse cyclic shift by N of the syndrome;

a second coset calculator circuit configured to calculate the coset leader with index N−K−L+/for the initial frame, the coset leader with index 0 for the initial frame being calculated to equal a reverse cyclic shift by K+L−1 of the syndrome;

a third coset calculator circuit configured to calculate the coset leader with index 0 for each of the plurality of frames other than the initial frame, the coset leader with index 0 for the frame being calculated to equal a cyclic shift by W of the coset leader with index 0 for a preceding frame of the plurality of frames;

a fourth coset calculator circuit configured to calculate the coset leader with index 1 for each of the plurality of frames other than the initial frame, the coset leader with index 1 for the frame being calculated to equal a cyclic shift by W−1 of the coset leader with index 0 for the preceding frame;

a fifth coset calculator circuit configured to calculate the coset leader with index N−K−L+1 for each of the plurality of frames other than the initial frame, the coset leader with index N−K−L+1 for the frame being calculated to equal a reverse cyclic shift by 1 of the coset leader with index 0 for the preceding frame;

a sixth coset calculator circuit configured to calculate the coset leader with index N−K−L+2 for each of the plurality of frames other than the initial frame, the coset leader with index N−K−L+2 for the frame being calculated to equal a cyclic shift by N−K−L+2 of the coset leader with index 0 for the preceding frame;

a seventh coset calculator circuit configured to calculate the coset leader with index N−K for each of the plurality of frames, the coset leader with index N−K for the frame being calculated to equal a cyclic shift by N−K of the coset leader with index 0 for the frame; and an eighth coset calculator circuit configured to calculate the coset leader with index W−N+K+L+1 for each of the plurality of frames, the coset leader with index W−N+K+L+1 for the frame being calculated to equal a cyclic shift by W−N+K+L+1 of the coset leader with index 0 for the frame.

17. A circuit for detecting a burst error in a block of a plurality of data bits, comprising:

a plurality of coset calculator circuits, each coset calculator circuit configured to calculate a respective coset leader from a syndrome generated from the plurality of data bits of the block;

wherein each coset calculator circuit is configured to calculate the respective coset leader for each of a plurality of frames of the plurality of data bits of the block, and the plurality of coset calculator circuits calculate the respective coset leaders in parallel;

a plurality of comparator circuits each coupled to input the respective coset leader from at least one of the plurality of coset calculator circuits, each comparator circuit being configured to determine in parallel with each other comparator circuit, for a burst-length portion within the respective coset leader, whether a plurality of coset bits of the respective coset leader are zero except for the plurality of coset bits within the burst-length portion; and an error-locator circuit coupled and responsive to the plurality of comparator circuits, the error-locator circuit being configured to output an error vector describing the burst error in the block in response to one of the plurality of comparator circuits determining that the plurality of coset bits of the respective coset leader are zero except for the plurality of coset bits within the burst-length portion within the respective coset leader.

18. The circuit of claim 17, wherein each comparator circuit is configured to determine whether the plurality of coset bits of the respective coset leader are zero except for the plurality of coset bits within the burst-length portion, which is a plurality of least significant bits of the plurality of coset bits of the respective coset leader.

19. The circuit of claim 17, wherein:

the plurality of coset calculator circuits are configured to calculate, in parallel for each frame of the plurality of frames, each respective coset leader for the frame; and the plurality of comparator circuits are configured to determine, in parallel for each frame of the plurality of frames, whether the plurality of coset bits of the respective coset leader are zero except for the plurality of coset bits within the burst-length portion within the respective coset leader for the frame.

20. The circuit of claim 17, further comprising an error-corrector circuit coupled to the error-locator circuit, wherein:

the error-corrector circuit successively inputs each frame of the plurality of frames;

the error-corrector circuit outputs a correction of the frame in response to the one of the plurality of comparator circuits determining that the plurality of coset bits of the respective coset leader are zero except for the plurality of coset bits within the burst-length portion within the respective coset leader for the frame, the correction being a bit-wise exclusive-or between the plurality of data bits in the frame and the plurality of coset bits within the burst-length portion within the respective coset leader for the frame; and the error-corrector circuit outputs the frame in response to none of the plurality of comparator circuits determining that the plurality of coset bits of the respective coset leader are zero except for the plurality of coset bits within the burst-length portion within the respective coset leader for the frame.

* * * * *